United States Patent
Morris

(10) Patent No.: US 6,396,315 B1
(45) Date of Patent: May 28, 2002

(54) VOLTAGE CLAMP FOR A FAILSAFE BUFFER

(75) Inventor: Bernard Lee Morris, Emmaus, PA (US)

(73) Assignee: Agere Systems Guardian Corp., Berkeley Heights, NJ (US)

( * ) Notice: Subject to any disclaimer, the term of this patent is extended or adjusted under 35 U.S.C. 154(b) by 0 days.

(21) Appl. No.: 09/304,619

(22) Filed: May 3, 1999

(51) Int. Cl.$^7$ .............................. H03B 1/00; H03K 3/00
(52) U.S. Cl. ..................... 327/112; 327/321; 327/108; 326/83; 326/14
(58) Field of Search ..................... 327/309, 318–321, 327/324, 331, 112, 310, 313, 314, 534, 108, 143, 198; 326/56–58, 82, 83, 85, 87, 14

(56) References Cited

U.S. PATENT DOCUMENTS

| | | | | | |
|---|---|---|---|---|---|
| 4,425,517 A | * | 1/1984 | Smith | ........................... | 326/58 |
| 5,373,199 A | * | 12/1994 | Shichinohe et al. | ......... | 327/328 |
| 5,418,476 A | * | 5/1995 | Strauss | ........................... | 326/58 |
| 5,444,401 A | * | 8/1995 | Crafts | ........................... | 327/108 |
| 5,471,150 A | * | 11/1995 | Jung et al. | ..................... | 326/87 |
| 5,493,244 A | * | 2/1996 | Pathak et al. | ............... | 327/313 |
| 5,534,811 A | * | 7/1996 | Gist et al. | .................... | 327/309 |
| 5,576,635 A | * | 11/1996 | Partovi et al. | ................. | 326/27 |
| 5,585,740 A | * | 12/1996 | Tipon | ........................... | 326/86 |
| 5,640,118 A | * | 6/1997 | Drouot | ......................... | 327/309 |
| 5,783,947 A | * | 7/1998 | Kawano | ........................ | 327/765 |
| 5,914,626 A | * | 6/1999 | Kim et al. | .................... | 327/309 |
| 5,942,923 A | * | 8/1999 | Gotoh | ........................... | 327/112 |
| 5,952,866 A | * | 9/1999 | Kothandaraman et al. | .. | 327/318 |
| 5,963,083 A | * | 10/1999 | Kothandaraman et al. | .. | 327/545 |
| 5,994,922 A | * | 11/1999 | Aoki et al. | .................... | 326/87 |
| 6,014,039 A | * | 1/2000 | Kothandaraman et al. | .... | 326/83 |
| 6,028,464 A | * | 2/2000 | Bremner | ...................... | 327/309 |
| 6,040,729 A | * | 3/2000 | Sanchez et al. | ............. | 327/309 |
| 6,072,333 A | * | 6/2000 | Tsukagoshi et al. | .......... | 326/58 |
| 6,072,351 A | * | 6/2000 | Sharpe-Geisler | ............ | 327/112 |
| 6,169,420 B1 | * | 1/2001 | Coddington et al. | .......... | 326/83 |
| 6,184,700 B1 | * | 2/2001 | Morris | ......................... | 326/14 |

* cited by examiner

Primary Examiner—Terry D. Cunningham
Assistant Examiner—Long Nguyen
(74) Attorney, Agent, or Firm—Stroock & Stroock & Lavan LLP

(57) ABSTRACT

A voltage clamp for a failsafe buffer used in connection with an electronic device. The voltage clamp clamps a voltage present at the output terminal of the buffer only when the electronic device is powered-on, and present a high impedance when the electronic device is not powered-on. Thus, when an electronic device such as a printer, for example, is connected to a network and the device is in a powered-on state, the voltage at the output terminal of the buffer is clamped to approximately the value of the electronic device power source. When the electronic device is powered-off, a voltage present at the output of the buffer will not clamped by the voltage clamp. Instead, the buffer will present a high impedance to the network and to other electronic devices connected thereto. Consequently, when an electronic device having a failsafe buffer constructed in accordance with the present invention enters an inoperable state due to device failure, power loss, etc., yet remains physically connected to the network and to other electronic devices, the inoperable device will not affect operation of other devices connected to the network.

42 Claims, 5 Drawing Sheets

VOLTAGE CLAMP FOR A FAILSAFE BUFFER

FIELD OF THE INVENTION

The invention relates to buffers and, more particularly, to a voltage clamp for a buffer in an electronic device, the buffer presenting a high impedance when the electronic device is in an inoperable state and clamping a voltage present at the output terminal of the buffer when the electronic device is in an operable state.

BACKGROUND OF INVENTION

A buffer provides an interface between a first electronic device which typically includes the buffer, and a network, second electronic device, or a plurality of other devices. For example, a buffer may be provided in a printer that connects to a network which has a plurality of computers or other electronic devices connected thereto. Loss of power or failure of an electronic device cannot adversely affect operation of other electronic devices connected to the inoperable electronic device. A failsafe buffer presents a high impedance to other electronic devices connected to the network when an electronic device including a failsafe buffer is powered-off or otherwise is rendered inoperable. Thus, a failsafe buffer does not affect operation of other devices on the network when the electronic device including the failsafe buffer fails, is powered-off, or is otherwise caused to be inoperable.

CMOS buffers generally include a P-channel transistor connected between the buffer power supply, VDD, and the output terminal, and a N-channel transistor connected between the output terminal and ground. The N-tub, which comprises the back gate of the P-channel transistor is typically connected directly to the power supply. Consequently, the parasitic diode formed between the P+ source and the N-tub of the P-channel will clamp any voltage at the output terminal of the buffer to a voltage approximately equal to VDD plus one diode voltage drop. In a failsafe buffer, however, connection to the parasitic diode is not permitted because loss of VDD would cause signals present at the output terminal to be clamped at 0.6 V. This result is clearly unacceptable.

However, it is desirable to include a clamp at the buffer output to reduce ringing (e.g., extraneous voltages, reflected signals, etc.) that may adversely affect operation of the electronic device within which the failsafe buffer is provided.

It is thus desirable to provide a voltage clamp for a failsafe buffer in an electronic device that clamps a voltage present at the output terminal of the buffer only when the electronic device is powered-on, i.e., only when VDD is present, and does not affect operation of other electronic devices when the electronic device is powered-off or otherwise rendered inoperable.

SUMMARY OF THE INVENTION

The present invention is directed to a failsafe buffer for an electronic device. The buffer includes an output terminal and means for clamping a voltage present at the output terminal to a predetermined voltage when the electronic device is in an operable state.

The present invention is also directed to a voltage clamp for a failsafe buffer having an output terminal and being connected to a power source for providing a voltage to the buffer. The voltage clamp comprises a plurality of serially connected switches operable in response to the power source such that a voltage present at the output terminal is limited to a first predetermined voltage when the power source provides a second predetermined voltage to the buffer.

The present invention is further directed to an electronic device comprising a power source for providing an operating voltage to the device. An operable state of the device is defined when the power source provides a first predetermined operating voltage to the device. The electronic device also includes a failsafe buffer having an output terminal and including a voltage clamp operable in response to the power source for clamping a voltage present at the output terminal to a predetermined voltage when the electronic device is in the operable state.

BRIEF DESCRIPTION OF THE DRAWINGS

In the drawing figures, which are not to scale, and which are merely illustrative, and wherein like reference characters denote similar elements throughout the several views.

DETAILED DESCRIPTION OF THE PRESENTLY PREFERRED EMBODIMENTS

The present invention is directed to a voltage clamp for a failsafe buffer in an electronic device that clamps a voltage present at the output terminal of the buffer only when the electronic device is powered-on. Thus, when an electronic device such as a printer, for example, is connected to a network and the device is in a powered-on state, the voltage at the output terminal of the buffer is clamped so as not to exceed a predetermined voltage. When the electronic device is powered-off (i.e., power is not provided to the buffer), the failsafe buffer will not clamp voltages at its output and, instead, will present a high impedance to the network and to other electronic devices connected thereto. Consequently, when an electronic device having a failsafe buffer constructed in accordance with the present invention enters an inoperable state due to device failure, power loss, etc., yet remains physically connected to the network and to other electronic devices, the inoperable device will not affect operation of other devices connected to the network. Although the term "failsafe" is used in connection with the disclosure of the present invention, such use is not intended to limit or otherwise restrict the scope or spirit of the present invention, which is directed to buffers that present a high impedance when in an inoperable state, and that clamp voltages present at their output terminals when in an operable state.

Figure 1:
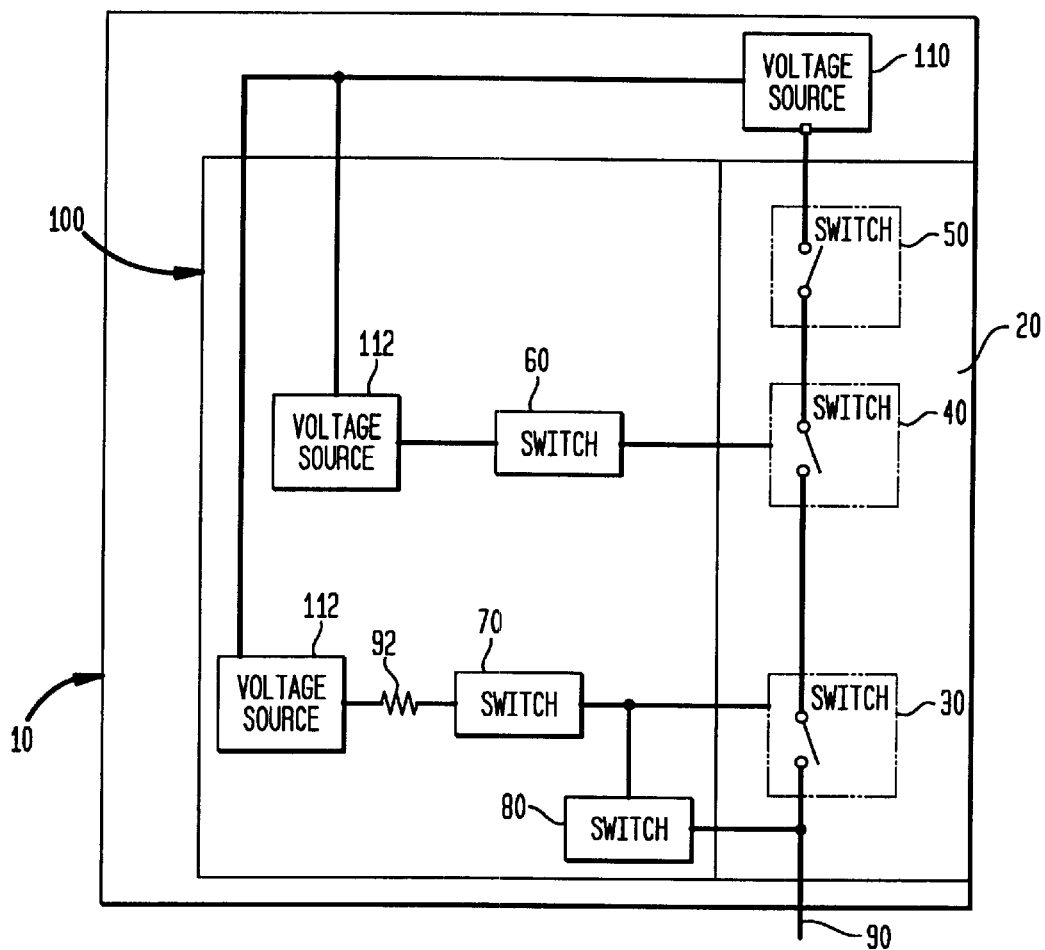
FIG. 1 is a schematic block diagram of an electronic device having a failsafe buffer including a voltage clamp in accordance with the present invention.

Referring now to the drawings in detail, FIG. 1 depicts a schematic block diagram of an electronic device 10 having a failsafe buffer 100 including a voltage clamp 20 in accordance with the present invention. The buffer 100 and voltage clamp 20 receive power from a voltage source 110 that may be the same voltage source that provides power to the electronic device 10 or it may be a voltage source derived from the electronic device voltage source. In either case, if a voltage is not supplied to the buffer 100, a voltage will not be supplied to the voltage clamp 20. The voltage clamp 20 includes a plurality of serially connected switches 30, 40, 50 (first, second, and third) that are either opened or closed depending on whether the electronic device is operable (i.e., turned on) or inoperable (i.e., turned off). The switches 30, 40, 50 also collectively cause the voltage at the buffer output terminal 90 to be limited or clamped to a predetermined voltage. The electronic device 10 is connectable to other electronic devices (e.g., directly, via a network, modem, etc.) through the output terminal 90 of the failsafe buffer 100.

The voltage clamp 20 of the present invention defines two states of operation—a clamping state when power is supplied to the failsafe buffer 100 (i.e., when the electronic device 10 is operable or operated) and a high impedance state when power is not supplied to the failsafe buffer 100 (i.e., when the electronic device 10 is inoperable or not operated). In the clamping state, the first and second switches 30, 40 are closed and the third switch 50 closes when the voltage present at the output terminal 90 exceeds the value of the voltage source 110 by a predetermined amount. In a preferred embodiment, the third switch 50 closes when the voltage at the output terminal 90 exceeds the value of the voltage source 110 by approximately one diode voltage drop (see, e.g., FIGS. 2–5). Thus, when the electronic device 10 is powered-on and power is supplied to the buffer 100, the voltage present at the output terminal 90 will be clamped to the value of the power source 110 plus one diode voltage drop.

When operating in the high impedance state (i.e., power is not supplied to the buffer 100), the electronic device 10 is inoperable and one of the first and second switches 30, 40 is open. Consequently, the output terminal 90 is not connected to the power source 110 (through the third switch 50) and a voltage present at the output terminal 90 is not clamped. In this state, the electronic device 10 is effectively removed from the network and presents a high impedance to the network. Consequently, failure of the electronic device 10 within which the failsafe buffer 100 is provided will not adversely affect operation of other electronic devices connected to the failed electronic device.

Figure 2:
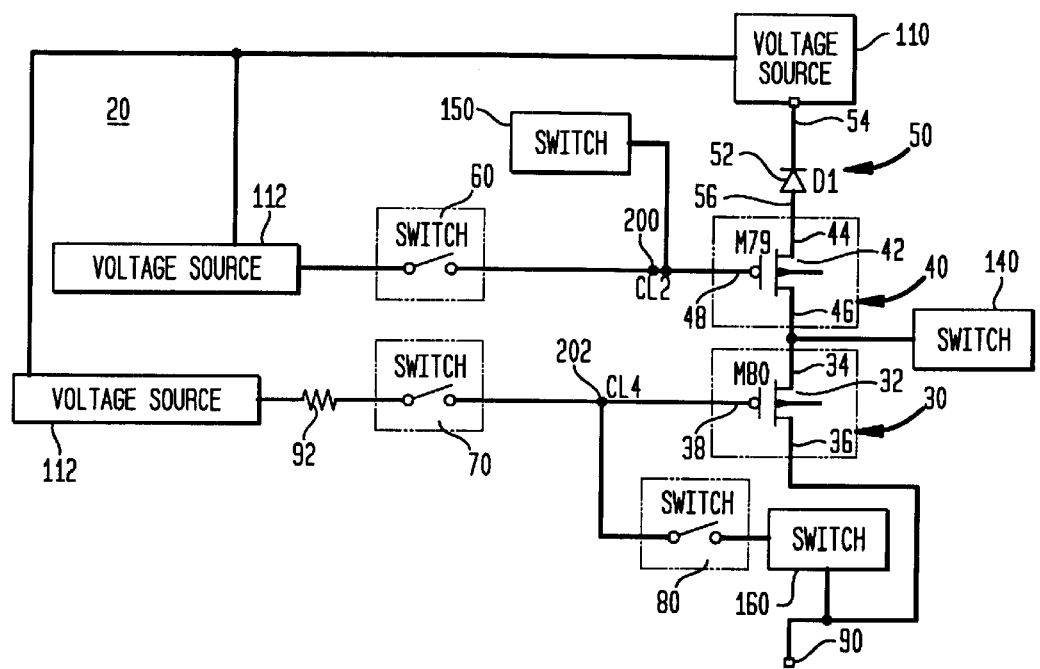
FIG. 2 is a more detailed, partial schematic and partial block diagram of the voltage clamp of FIG. 1.

Referring next to FIG. 2, a more detailed diagram of the voltage clamp 20 of the present invention is provided. In a preferred embodiment, the first and second switches 30, 40 are first and P-channel transistors 32, 42 (M80 and M79) and the third switch 50 is a diode 52 (D1). The cathode 54 of the diode 52 is connected to the power source 110 and the anode 56 of the diode 52 is connected to the drain 44 of the second transistor 42. The source 46 of the second transistor 42 is connected to the drain 34 of the first transistor 32, whose source 36 is connected to the output terminal 90. A voltage source 112 is connected to the gate 48 of the second transistor 42 through a fourth switch 60. A node 200 (CL2) is defined approximately at the interconnection point of the fourth switch 60 and the gate 48. Voltage source 112 is different from, but dependent upon voltage source 110. In a preferred embodiment, voltage source 112 is approximately one-third the value of voltage source 110 (see, e.g., FIG. 4).

Voltage source 112 is also connected to the gate 38 of the first transistor 32 through a fifth switch 70 and a resistor 92. A sixth switch 80 is connected between the source 36 and gate 38 of the second transistor 32. A node 202 (CL4) is defined approximately at the interconnection point of the fifth and sixth switches 70, 80, and the gate 38 of the first transistor 32.

In a preferred embodiment, when the voltage source 110 supplies a predetermined voltage to the cathode 54 of the diode 52, switches 60, 70 are closed, and switch 80 is open. The voltage source 110, also designated as VDD5 herein, is preferably approximately 5 volts DC ("VDC"). The gates 38, 48 of the first and second transistors 32, 42 are connected to voltage source 112, which is approximately equal to 1.6 VDC when VDD is 5 volts. Thus, the first and second transistors 32, 42 are turned on, and the output terminal 90 is connected to the anode 56 of the diode 52. A voltage present at the output terminal 90 will thus be clamped to the voltage level of the voltage source 110, i.e., 5 VDC, plus the voltage drop across the diode 52, i.e., 0.6 VDC for a silicon diode. Thus, when an electronic device 10 is powered-on, i.e., operable, and includes a failsafe buffer 100 having a voltage clamp 20 in accordance with the present invention, voltages present at the output terminal 90 of the buffer 100 will not exceed the supply voltage to the buffer, plus approximately one diode voltage drop.

If the electronic device 10 is in an inoperable state and a voltage is not provided to the buffer 100, the voltage clamp 20 effectively disconnects the electronic device 10 from the network, for example, and thus prevents the inoperable device 10 from affecting the operation of other electronic devices connected to the network. With no power supplied to the cathode 54 or to switches 60, 70, switch 80 is closed and the voltage at node 202 (CL4) is approximately at the level of the voltage present at the output terminal 90. The resistor 92 provided in series with switch 70 ensures that the voltage at node 202 follows the voltage at the output terminal 90, instead of following the voltage of the voltage source 112. When a logic high (i.e., approximately >3.3 VDC) is present at the output terminal 90, node 202 is also a logic high and the first transistor 32 is turned off. Consequently, the output terminal 90 is disconnected from the diode 52 and the electronic device 10 within which the inventive diode clamp 20 is provided is isolated from other electronic devices connected to the network.

Before proceeding with a more detailed discussion of the voltage clamp 20 of the present invention (see, e.g. FIG. 3), a brief discussion is provided for the various power sources used in connection with the inventive voltage clamp 20.

Figure 4:
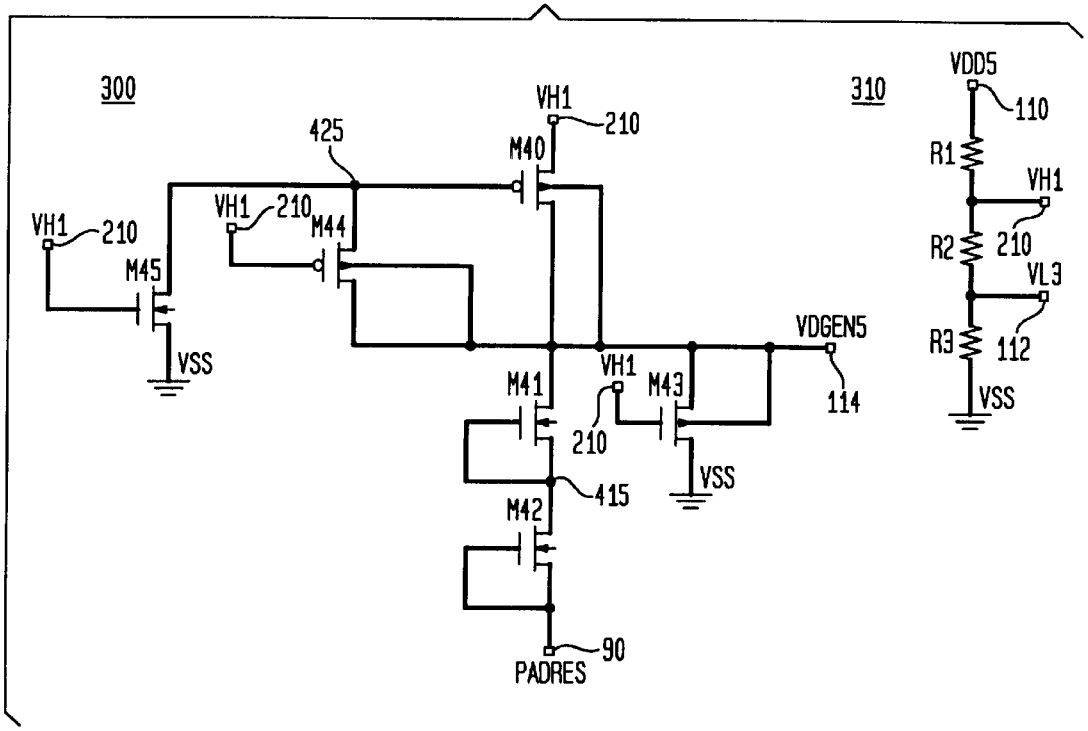
FIG. 4 is a detailed schematic diagram of a voltage generation circuit used in connection with the voltage clamp of the present invention.

Referring next to FIG. 4, a voltage generation circuit 300 that generates voltage VDGEN5, also designated as reference numeral 114 in the drawings, is there depicted. The value of voltage VDGEN5 depends on the presence or absence of power supply VDD5 (110), which is nominally 5 VDC, which, in turn, depends on whether the electronic device 10 is operable (powered-on) or inoperable (powered-off). Also depicted in FIG. 4 is a voltage divider 310 that provides voltages VH1 and VL3, also respectively designated as reference numerals 210 and 112 in the drawings, for the voltage generation circuit 300. Voltage VH1 is approximately equal to $\frac{2}{3}$ VDD5 (i.e., 3.3 VDC), and voltage VL3 is approximately equal to $\frac{1}{3}$ VDD5 (i.e., 1.6 VDC). In general, when VDD5 is present, VDGEN5 is approximately equal to 3.3 VDC. When VDD5 is not present, VDGEN5 is approximately equal to a voltage present at the output terminal 90, minus two diode voltage drops.

With continued reference to FIG. 4, when VDD5 is present (i.e., the electronic device 10 is powered-on or in an operable state), and VH1 is approximately equal to 3.3 VDC, transistor M45 is turned on and the gate of transistor M40 is pulled to ground. Transistor M40 is a relatively large device and thus provides a low resistance path from VH1 to VDGEN5. Consequently, VDGEN5 is approximately equal to VH1, i.e., approximately equal to 3.3 VDC when the electronic device is operable. When VDD5 is not present (i.e., the electronic device 10 is powered-off or in an inoperable state), voltage VH1 is approximately equal to 0 VDC, transistors M45 and M40 are off, and transistors M43 and M44 are on. For a voltage present at the output terminal 90, a path is defined consisting of two N-channel devices, namely, transistors M41 and M42, which are diode connected, and transistor M43 which acts as a high value (i.e., approximately 1 megaohm) resistor. In this case, the value of voltage VDGEN5 is approximately two diode drops below the voltage at the output terminal 90. For example, when the voltage at the output terminal 90 is approximately 5 VDC, VDGEN5 is equal to approximately 2.8 VDC. None of the transistors provided in the voltage generation circuit 300 depicted in FIG. 4 have a gate or source-to-drain voltage greater than VDD (i.e., 3.6 VDC max) in the case where VDD5 equals zero or in the case when VDD5 is normally on.

Figure 5:
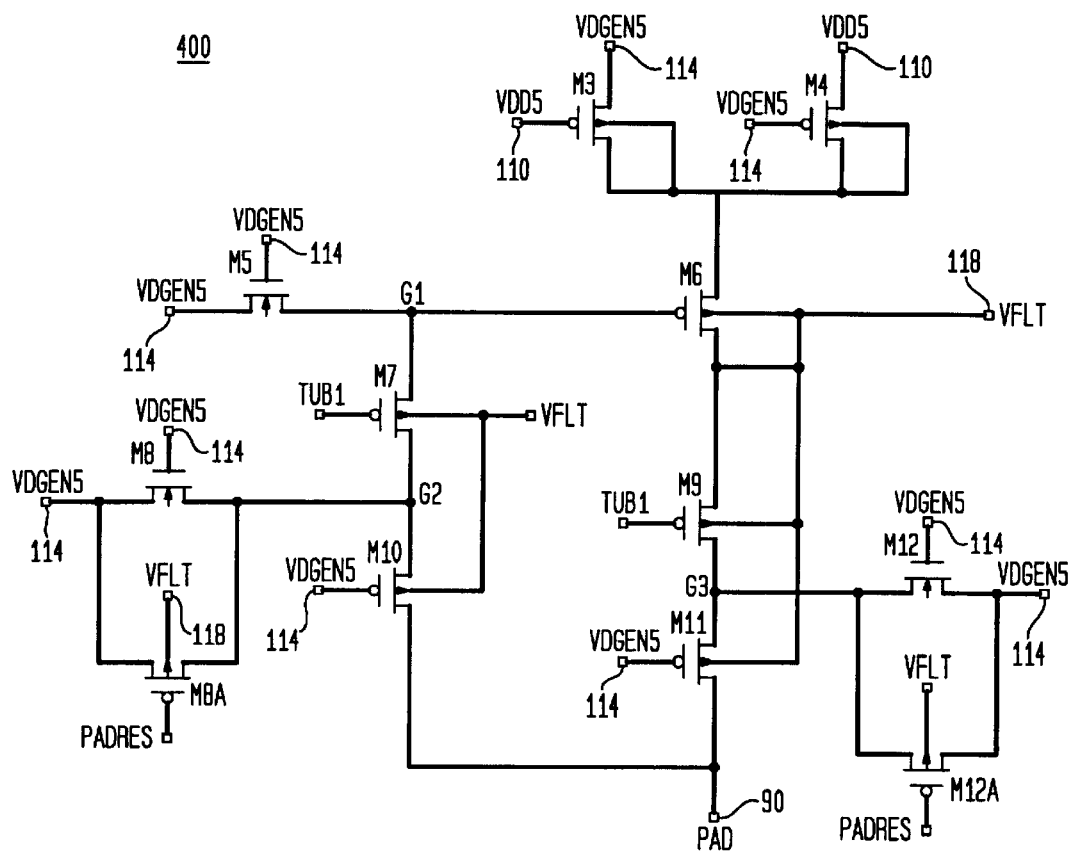
FIG. 5 is a schematic diagram of a backgate bias circuit used in connection with the voltage clamp of the present invention.

Backgate bias is provided to the P-channel transistors of the voltage clamp 20 (see, e.g., FIG. 3) by voltage VFLT, also designated as reference numeral 118, which is generated by the voltage generation circuit 400 depicted in FIG. 5. In operation, when VDD5 equals 5 VDC, VDGEN5 approximately equals 3.3 VDC, which turns transistor M4 on and transistor M3 off. This sets node TUB1 equal to VDD5 and transistors M7 and M9 are turned off. Node G1 will be set to VDGEN5 by transistor M5, which is turned on. This turns on transistor M6, setting node VFLT approximately equal to 5 VDC. Transistors M8 and M8A hold node G2 at VDGEN5 and transistors M12 and M12A hold node G3 at VDGEN5. This protects transistors M10 and M11, respectively, from ever seeing 3.6 VDC across their drain-source junctions.

When VDD5 equals zero and a 5 VDC signal is present at the output terminal 90, VDGEN5 will be equal to about 2.8 VDC, turning transistor M3 on and transistor M4 off. This connects TUB1 to VDGEN5. In this case transistors M7 and M9, as well as transistors M10 and M11 will be on, connecting nodes VFLT and G1 to the output terminal 90. This turns off transistor M6. Transistors M8A and M12A will also be off. The diode-connected transistors M8 and M12 will not conduct in either direction. Therefore, none of the transistors shown in FIG. 5 can have more than 3.6 VDC across any pair of their nodes.

As discussed above, the voltage clamp 20 of the present invention provides means for clamping a voltage present at an output terminal 90 of a failsafe buffer 100 to a predetermined voltage only when the electronic device 10 within which the buffer 100 is provided is in an operable state. Clamping in this manner eliminates the adverse affect of ringing, reflected signals, noise, etc., at the output terminal 90 on operation of the electronic device 10. When the electronic device 10 is inoperable, the voltage clamp 20 of the present invention effectively removes the electronic device 10 from the network and presents a high impedance to other electronic devices connected to the output terminal 90.

Figure 3:
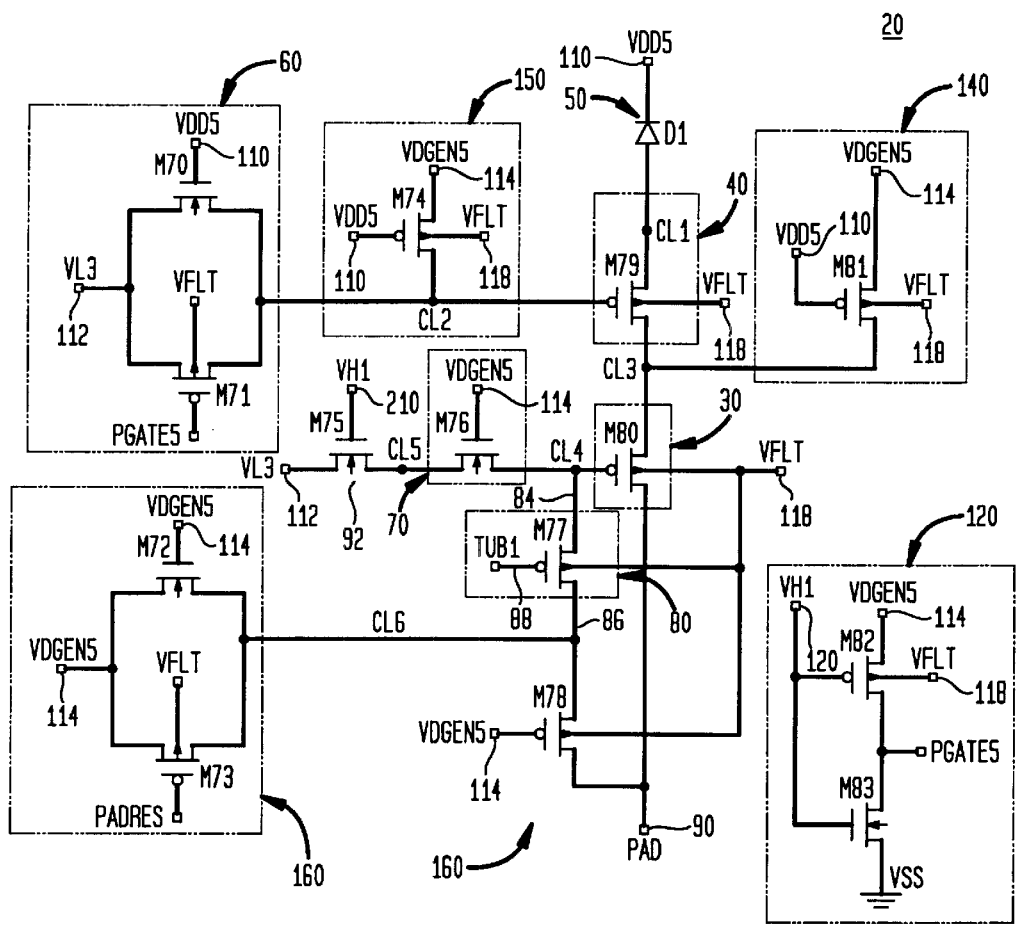
FIG. 3 is a detailed schematic diagram of the voltage clamp of the present invention.

Referring next to FIG. 3, the operation of the voltage clamp 20 of the present invention will now be discussed in detail. When the electronic device 10 is in a operable state, VDD5 is approximately equal to 5 VDC, VDGEN5 equals VH1 (3.3 VDC) and VL3 equals 1.6 VDC. An inverter 120 comprised of transistors M82 and M83 will set node PGATE5 at approximately zero, which fully closes fourth switch 60 comprised of transistors M70 and M71. This, in turn, sets node CL2 approximately equal to VL3, or 1.6 VDC, which turns on transistor M79, i.e. closes second switch 40. Node TUB1 (see, e.g., FIG. 5) equals 5 VDC, which turns off transistor M77, i.e. opens the sixth switch 80. This allows transistor M76 to hold node CL4 at VL3 (1.6 VDC) turning on transistor M80, i.e., closing first switch 30. A path between the output terminal 90 and diode 52 is thus provided. Voltages present at the output terminal 90 are thus clamped at a maximum voltage approximately equal to VDD5 plus one diode voltage drop.

When the electronic device is in an inoperable state, VDD5 equals zero and the diode 52 is disconnected from the output terminal 90. In this case, VH1 and VL3 also equal zero, and TUB1 equals VDGEN5, which is two diode drops below the value of a voltage at the output terminal 90. For example, if the voltage present at the output terminal 90 equals 5 VDC, then VDGEN5 approximately equals 2.8 VDC (the diode voltage drop across a P-channel transistor being approximately equal to 1.1 VDC). Node PGATE is held high (at VDGEN5, for example) by the inverter 120 comprising transistors M82 and M83, which opens switch 60. Transistor M77 is also on, while transistor M76 is off. This connects node CL4 to the output terminal 90, completely turning off transistor M80, i.e. opening the first switch 30. Since transistor M80 is off, diode D1 is not connected to the output terminal 90. Consequently, no clamping of voltages at the output terminal 90 occurs and the voltage clamp 20 presents a high impedance to any signal on the output terminal 90.

The voltage clamp 20 of the present invention also includes several other voltage clamp circuits 140, 150, 160 that ensure that the voltages across all gate-oxide and source-drain junctions do not exceed 3.6 volts. Transistors M72, M73 and M78 define voltage clamp 160 and limit the voltage on node CL6 to approximately VDGEN5 or 3.3 VDC. This prevents excessive voltage across the gate-oxide of transistor M77 if the voltage at the output terminal 90 equals zero. Likewise, transistors M74 and M81 define voltage clamps 150 and 140, respectively, and keep nodes CL2 and CL3, respectively, at known voltages when VDD5 equals zero. Transistor M75, which is connected in series with transistor M76, limits the voltage across the gate of transistor M76 to 3.6 VDC at all times.

With reference to FIGS. 2 and 3, the configuration of the voltage clamp 20 of the present invention will now be discussed in detail. Voltage source VDD5 is preferably a 5 VDC power supply derived from the electronic device power and that provides power to the voltage clamp 20 and from which voltages VH1 and VL3 are derived (see, e.g., FIG. 4). The cathode 54 of diode 52 is connected to VDD5, and the anode 56 is connected to the drain 44 of transistor M79. The source 46 of transistor M79 is connected to the drain 34 of transistor M80, with a node CL3 being defined at this interconnection point. Node CL3 also connects to voltage clamp 140 comprised of transistor M81. The source of transistor M80 is connected to the output terminal 90 of the failsafe buffer 100.

The gate 48 of transistor M79 is connected to fourth switch 60 comprised of N-channel transistor M70 and P-channel transistor M71. Node CL2 is defined at the interconnection point between the gate 48 and switch 60 and voltage clamp 150, comprised of transistor M74, is also connected at this point.

The gate 38 of transistor M80 is connected to fifth switch 70 comprised of transistor M76 and defining node CL4 at the interconnection therebetween. The drain 84 of transistor M77 is connected to node CL4, and the source 86 of transistor M77 is connected to the drain of transistor M78, with the interconnection point therebetween defining node CL6. The source of transistor M78 is connected to the output terminal 90. A voltage clamp 160, comprised of N-channel transistor M72 and P-channel transistor M73, is also connected to node CL6.

Backgate bias for all P-channel transistors is provided by voltage VFLT (see, e.g., FIG. 5).

While the above-description has been directed generally to a printer as the electronic device, it will be obvious to persons skilled in the art that other electronic devices are also contemplated by the present invention. Virtually any electronic device, component, system, circuit, including integrated circuits, using or requiring a buffer or an interface to a communications medium such as, for example, a local-area-network, a modem, the Internet, a cellular link, can employ the voltage clamp of the present invention. Any discussion herein directed to a specific type of electronic device is merely illustrative and provided as a non-limiting example.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. A failsafe buffer for an electronic device, said failsafe buffer presenting a high impedance output when the electronic device is not operated, said failsafe buffer comprising an output terminal and means for clamping a voltage present at said output terminal to a predetermined voltage when the electronic device is operated, wherein said failsafe buffer is connected to a power source for providing a voltage to said failsafe buffer, and wherein a voltage present at said output terminal is caused to be limited to approximately the voltage of the power source when the electronic device is operated, and wherein said clamping means comprises:
   a diode having a cathode connected to the power source; and
   two switches connected in series with each other and connected between said output terminal and said diode;
   said switches being in a closed position when the electronic device is operated so that a voltage presented at said output terminal is caused to be approximately equal to the voltage of the power source.

2. A failsafe buffer as recited by claim 1, wherein said two switches each comprise a P-channel transistor, a drain of a first one of said P-channel transistors being connected to an anode of said diode, a source of said first one of said P-channel transistors being connected to a drain of a second one of said P-channel transistors, and a source of said second one of said P-channel transistors being connected to said output terminal.

3. A failsafe buffer as recited by claim 1, wherein said failsafe buffer is connected to a power source for providing a voltage to said failsafe buffer, said failsafe buffer further comprising means, dependent upon said power source for providing a voltage to said failsafe buffer, for generating a plurality of voltages for use by said clamping means.

4. A failsafe buffer as recited by claim 1, further comprising means for limiting voltages in said clamping means.

5. A failsafe buffer as recited by claim 4, wherein said limiting means comprises a voltage clamp connected at a node defined between said two switches to limit the voltage at said node when the electronic device is not operated.

6. A failsafe buffer as recited by claim 2, further comprising means for generating a backgate bias for each said P-channel transistor.

7. A failsafe buffer as recited by claim 1, wherein said power source for providing a voltage to said failsafe buffer is derived from a power source for the electronic device.

8. A voltage clamp for a failsafe buffer, the failsafe buffer presenting a high impedance output when the failsafe buffer is not operated and having an output terminal and being connected to a power source for providing a voltage to the failsafe buffer, said voltage clamp comprising a plurality of serially connected switches operated in response to the power source such that a voltage present at the output terminal of the failsafe buffer is approximately limited to the voltage of the power source when the failsafe buffer is operated, and wherein said plurality of serially connected switches comprises:
   a diode having a cathode connected to the power source; and
   two P-channel transistors connected in series to each other and connected between said diode and the output terminal;
   said two P-channel transistors being turned on when the power source provides said second predetermined voltage to the failsafe buffer.

9. A voltage clamp as recited by claim 8, wherein a drain of a first one of said P-channel transistors is connected to an anode of said diode, a source of said first one of said P-channel transistors is connected to a drain of a second one of said P-channel transistors, and a source of said second one of said P-channel transistors is connected to the output terminal.

10. An electronic device comprising:
   a power source for providing an operating voltage to said device; and
   a failsafe buffer presenting a high impedance output when said electronic device is not operated, said failsafe buffer having an output terminal and including a voltage clamp operated in response to said power source for limiting a voltage present at said output terminal to approximately the operating voltage when said electronic device is operated, wherein said voltage clamp comprises a plurality serially connected switches comprising:
      a diode having a cathode connected to said power source; and
      two P-channel transistors connected in series to each other and connected between said diode and said output terminal.

11. An electronic device as recited by claim 10, wherein said voltage clamp further comprises means, dependent upon said power source, for generating a plurality of voltages for use by said voltage clamp.

12. An electronic device as recited by claim 10, wherein said voltage clamp further comprises means for limiting voltages in said voltage clamp.

13. An electronic device as recited by claim 12, wherein said limiting means comprises a voltage clamp connected at a node defined between said two switches to limit the voltage at said node when said electronic device is not operated.

14. An integrated circuit including a failsafe buffer for an electronic device, said failsafe buffer presenting a high impedance output when the electronic device is not operated and comprising an output terminal and means for clamping a voltage present at said output terminal to a predetermined voltage when the electronic device is operated, wherein said failsafe buffer is connected to a power source for providing a voltage to said failsafe buffer, and wherein a voltage present at said output terminal is caused to be limited to approximately the voltage of the power source when the electronic device is operated, and wherein said failsafe buffer is connected to a power source for providing a voltage to said failsafe buffer, and wherein said clamping means comprises:

a diode having a cathode connected to the power source; and two switches connected in series with each other and connected between said output terminal and said diode;

said switches being in a closed position when electronic device is operated so that a voltage presented at said output terminal is caused to be approximately equal to the voltage of the power source.

15. An integrated circuit as recited by claim 14, wherein said two switches each comprise a P-channel transistor, a drain of a first one of said P-channel transistors being connected to an anode of said diode, a source of said first one of said P-channel transistors being connected to a drain of a second one of said P-channel transistors, and a source of said one of said P-channel transistors being connected to said output terminal.

16. An integrated circuit as recited by claim 14, wherein said failsafe buffer is connected to a power source for providing a voltage to said failsafe buffer, said failsafe buffer further comprising means, dependent upon said power source for providing a voltage to said failsafe buffer, for generating a plurality of voltages for use by said clamping means.

17. An integrated circuit as recited by claim 14, further comprising means for limiting voltages in said clamping means.

18. An integrated circuit as recited by claim 17, wherein said limiting means comprises a voltage clamp connected at a node defined between said two switches to limit the voltage at said node when the electronic device is not operated.

19. An integrated circuit as recited by claim 15, further comprising means for generating a backgate bias for each said P-channel transistor.

20. An integrated circuit as recited by claim 14, wherein said power source for providing a voltage to said buffer is derived from a power source for the electronic device.

21. An integrated circuit including a voltage clamp for a failsafe buffer, the failsafe buffer presenting a high impedance output when the failsafe buffer is not operated and having an output terminal and being connected to a power source for providing a voltage to the failsafe buffer, said voltage clamp comprising a plurality of serially connected switches operated in response to the power source such that a voltage present at the output terminal of the failsafe buffer is limited to approximately the voltage of the power source when the failsafe buffer is operated wherein said plurality of serially connected switches comprises:

a diode having a cathode connected to the power source; and two P-channel transistors connected in series to each other and connected between said diode and the output terminal;

said two P-channel resistors being turned on when the power source provides said second predetermined voltage to the buffer.

22. An integrated circuit as recited by claim 21, wherein a drain of a first one of said P-channel transistors is connected to an anode of said diode, a source of said first one of said P-channel transistors is connected to a drain of a second one of said P-channel transistors, and a source of said second one of said P-channel transistors is connected to the output terminal.

23. A failsafe buffer for an electronic device, said failsafe buffer presenting a high impedance output when the electronic device is not operated, said failsafe buffer comprising an output terminal and means for clamping a voltage present at said output terminal to a predetermined voltage when the electronic device is operated, wherein said failsafe buffer is connected to a power source for providing a voltage to said failsafe buffer, and wherein said clamping means comprises:

a diode having a cathode connected to the power source; and two switches connected in series with each other and connected between said output terminal and said diode;

said switches being in a closed position when the electronic device is operated so that a voltage presented at said output terminal is caused to be approximately equal to the voltage of the power source.

24. A failsafe buffer as recited by claim 23, wherein said two switches each comprise a P-channel transistor, a drain of a first one of said P-channel transistors being connected to an anode of said diode, a source of said first one of said P-channel transistors being connected to a drain of a second one of said P-channel transistors, and a source of said second one of said P-channel transistors being connected to said output terminal.

25. A failsafe buffer as recited by claim 23, wherein said failsafe buffer is connected to a power source for providing a voltage to said failsafe buffer, said failsafe buffer further comprising means, dependent upon said power source for providing a voltage to said failsafe buffer, for generating a plurality of voltages for use by said clamping means.

26. A failsafe buffer as recited by claim 23, further comprising means for limiting voltages in said clamping means.

27. A failsafe buffer as recited by claim 26, wherein said limiting means comprises a voltage clamp connected at a node defined between said two switches to limit the voltage at said node when the electronic device is not operated.

28. A failsafe buffer as recited by claim 24, further comprising means for generating a backgate bias for each said P-channel transitor.

29. A voltage clamp for a failsafe buffer, the failsafe buffer presenting a high impedance output when the failsafe buffer is not operated and having an output terminal and being connected to a power source for providing a voltage to the failsafe buffer, said voltage clamp comprising a plurality of serially connected switches operated in response to the power source such that a voltage present at the output terminal of the failsafe buffer is limited to a first predetermined voltage when the power source provides a second predetermined voltage to the buffer, wherein said plurality of serially connected switches comprises:

a diode having a cathode connected to the power source; and two P-channel transistors connected in series to each other and connected between said diode and the output terminal;

said two P-channel transistors being turned on when the power source provides said second predetermined voltage to the failsafe buffer.

30. A voltage clamp as recited by claim 29, wherein a drain of a first one of said P-channel transistors is connected to an anode of said diode, a source of said first one of said P-channel transistors is connected to a drain of a second one of said P-channel transistors, and a source of said second one of said P-channel transistors is connected to the output terminal.

31. An electronic device comprising:
   a power source for providing an operating voltage to said device; and
   a failsafe buffer presenting a high impedance output when said electronic device is not operated, said failsafe buffer having an output terminal and including a voltage clamp operated in response to said power source for clamping a voltage present at said output terminal to a predetermined voltage when said electronic device is operated, wherein said voltage clamp comprises a plurality serially connected switches, and wherein said plurality of serially connected switches comprises;
      a diode having a cathode connected to said power source; and
      two P-channel transistors connected in series to each other and connected between said diode and said output terminal.

32. An electronic device as recited by claim 31, wherein said voltage clamp further comprises means, dependent upon said power source, for generating a plurality of voltages for use by said voltage clamp.

33. An electronic device as recited by claim 31, wherein said voltage clamp further comprises means for limiting voltages in said voltage clamp.

34. An electronic device as recited by claim 33, wherein said limiting means comprises a voltage clamp connected at a node defined between said two switches to limit the voltage at said node when said electronic device is not operated.

35. An integrated circuit including a failsafe buffer for an electronic device, said failsafe buffer presenting a high impedance output when the electronic device is not operated and comprising an output terminal and means for clamping a voltage present at said output terminal to a predetermined voltage when the electronic device is operated, wherein said failsafe buffer is connected to a power source for providing a voltage to said failsafe buffer, and wherein said clamping means comprises:
   a diode having a cathode connected to the power source; and
   two switches connected in series with each other and connected between said output terminal and said diode;
   said switches being in a closed position when electronic device is operated so that a voltage presented at said output terminal is caused to be approximately equal to the voltage of the power source.

36. An integrated circuit as recited by claim 35, wherein said two switches each comprise a P-channel transistor, a drain of a first one of said P-channel transistors being connected to an anode of said diode, a source of said first one of said P-channel transistors being connected to a drain of a second one of said P-channel transistors, and a source of said second one of said P-channel transistors being connected to said output terminal.

37. An integrated circuit as recited by claim 35, wherein said failsafe buffer is connected to a power source for providing a voltage to said failsafe buffer, said failsafe buffer further comprising means, dependent upon said power source for providing a voltage to said failsafe buffer, for generating a plurality of voltages for use by said clamping means.

38. An integrated circuit as recited by claim 35, further comprising means for limiting voltages in said clamping means.

39. An integrated circuit as recited by claim 38, wherein said limiting means comprises a voltage clamp connected at a node defined between said two switches to limit the voltage at said node when the electronic device is not operated.

40. An integrated circuit as recited by claim 36, further comprising means for generating a backgate bias for each said P-channel transistor.

41. An integrated circuit including a voltage clamp for a failsafe buffer, the failsafe buffer presenting a high impedance output when the failsafe buffer is not operated and having an output terminal and being connected to a power source for providing a voltage to the failsafe buffer, said voltage clamp comprising a plurality of serially connected switches operated in response to the power source such that a voltage present at the output terminal of the failsafe buffer is limited to a first predetermined voltage when the power source provides a second predetermined voltage to the failsafe buffer, wherein said plurality of serially connected switches comprises:
   a diode having a cathode connected to the power source; and
   two P-channel transistors connected in series to each other and connected between said diode and the output terminal;
   said two P-channel transistors being turned on when the power source provides said second predetermined voltage to the buffer.

42. An integrated circuit as recited by claim 41, wherein a drain of a first one of said P-channel transistors is connected to an anode of said diode, a source of said first one of said P-channel transistors is connected to a drain of a second one of said P-channel transistors, and a source of said second one of said P-channel transistors is connected to the output terminal.

* * * * *